United States Patent
Kwon et al.

(10) Patent No.: US 6,882,561 B2
(45) Date of Patent: Apr. 19, 2005

(54) SEMICONDUCTOR MEMORY DEVICE COMPRISING MEMORY HAVING ACTIVE RESTORATION FUNCTION

(75) Inventors: Kee-won Kwon, Sungnam (KR); Su-jin Ahn, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/649,850

(22) Filed: Aug. 26, 2003

(65) Prior Publication Data
US 2004/0052123 A1 Mar. 18, 2004

(30) Foreign Application Priority Data
Sep. 14, 2002 (KR) .................................. 10-2002-0055966

(51) Int. Cl.[7] .............................................. G11C 11/24
(52) U.S. Cl. ....................................... 365/149; 365/190
(58) Field of Search ................................ 365/149, 222, 365/190, 185.08

(56) References Cited

U.S. PATENT DOCUMENTS

| | | | | |
|---|---|---|---|---|
| 5,122,986 A | * | 6/1992 | Lim | 365/189.11 |
| 6,169,308 B1 | | 1/2001 | Sunami et al. | 257/321 |
| 6,639,862 B1 | * | 10/2003 | Spirkl | 365/222 |

* cited by examiner

Primary Examiner—Tan T. Nguyen
(74) Attorney, Agent, or Firm—Mills & Onello LLP

(57) ABSTRACT

A semiconductor memory device includes a sense line, a data line, a memory connected between the sense line and the data line having an active restoration function, and a sense amplifier connected between the sense line and the data line. The sense amplifier senses and inverts the data in the sense line, and outputs the inverted data to the data line. The polarity of the data on the sense line is opposite the polarity of the data on the data line, and the data in the data line are written to the memory. The semiconductor memory device is capable of performing an active restoration function which makes it possible to rewrite the result of sensing operations from the sense amplifier without the need for an additional circuit or operations.

13 Claims, 7 Drawing Sheets

SEMICONDUCTOR MEMORY DEVICE COMPRISING MEMORY HAVING ACTIVE RESTORATION FUNCTION

BACKGROUND OF THE INVENTION

This application claims the priority of Korean Patent Application No. 2002-55966, filed Sep. 14, 2002, in the Korean Intellectual Property Office, the disclosure of which is incorporated herein in its entirety by reference.

1. Field of the Invention

The present invention relates to a semiconductor memory device, and more particularly, to a semiconductor memory device including a sense amplifier which is laid out between a sense line and a data line of a memory device having an active restoration function and a semiconductor memory device including a latch-type sense amplifier which utilizes the memory device having the active restoration function as a part of the latch.

2. Description of the Related Art

Semiconductor memory devices may be generally classified as random access memory (RAM) and read only memory (ROM), based on the type of memory cell employed.

A RAM device is capable of the random writing, storing, and reading of data. The RAM is a volatile memory in which data stored therein is lost if supply voltage to the RAM is interrupted.

A dynamic random access memory (DRAM) is a special form of RAM commonly used as a storage device in a computer, in which a memory cell for storing information includes a single storage capacitor and a single transistor for reading data stored in the storage capacitor. Data stored in the memory cell of the DRAM are lost over a certain period of time due to leakage current. Therefore, the DRAM requires a periodic refresh so as to restore data stored in the storage capacitor before the data are lost.

ROM, on the other hand, can preserve data indefinitely, even when the supply voltage to the ROM is blocked. Accordingly, ROM is referred to as a non-volatile memory and thus it does not require a periodic refresh.

The art related to the memory having the active restoration function used in semiconductor memory devices is well described in U.S. Pat. No. 6,169,308.

FIG. 1 is a sectional view of a ROM in the form of a conventional scalable two-transistor memory (STTM), and FIG. 2 is a circuit diagram of the STTM of FIG. 1.

Referring to FIGS. 1 and 2, reference numeral 10 denotes a silicon substrate, 20 denotes a sense line or a bit line, 30 denotes a ground line, 40 denotes a field insulator, 50 denotes an insulator layer such as a gate oxide layer, 60 denotes a data line, 70 denotes a storage node, and 80 denotes a word line or a control gate. Reference numeral 200 denotes a memory cell of the STTM, and Cp denotes a parasitic capacitor.

Data, in the form of charge stored in the storage node 70, are held or read in response to the voltage level supplied on the word line 80. The data or charge provided on the data line 60 is written in the storage node 70 according to the voltage supplied to the word line 80. The voltage level of the word line 80 for writing the data in the data line 60 to the storage node 70 is higher than the voltage level of the word line 80 for reading the data stored in the storage node 70 through the bit line 20.

Reference numeral 210 represents a transistor for reading out the data, and reference numeral 230 is a transistor for writing the data in the data line 60 to the storage node 70.

The STTM of FIGS. 1 and 2 is a non-volatile memory. However, since the characteristics of vertical STTM that are manufactured using a polycrystalline silicon are relatively poor, the information stored in the vertical STTM volatizes, and the read operation of the vertical STTM is therefore a destructive read in which the information stored in the STTM is lost. Therefore, whenever the information stored in the STTM is accessed or read, the STTM requires an active restoration function in which the result of accessing or reading the information is written back to the STTM. The STTM is therefore an example of a memory device having such an active restoration function.

The data in the sense line or the bit line 20 have an opposite polarity, e.g., low, with respect to the polarity, e.g., high, of the data stored in the storage node 70, and thus the corresponding sense amplifier (not shown) amplifies the data in the sense line or the bit line 20 and then writes data having an opposite polarity to the sense line data back into the STTM 200.

Accordingly, in the conventional STTM, an additional circuit for memorizing the number of accesses to the STTM, e.g., an even number or an odd number, and an additional circuit for determining whether the polarity of the data (e.g. negative or positive) stored in the STTM are required.

SUMMARY OF THE INVENTION

The present invention is directed to a semiconductor memory device having a restoration function which makes it possible to rewrite the result of a sensing operation from the sense amplifier to the data line without the need for additional circuits or operations.

According to an aspect of the present invention, there is provided a semiconductor memory device comprising a sense line, a data line, a memory connected between the sense line and the data line having an active restoration function, and a sense amplifier connected between the sense line and the data line. The sense amplifier senses, amplifies, and inverts the data in the sense line, and outputs the inverted data to the data line. The polarity of the data on the sense line is opposite to the polarity of the data on the data line, and the data in the data line are written to the memory.

The memory having an active restoration function includes a storage node having a gate of a transistor formed on a semiconductor substrate, the data line is deposited on the storage node, the word line is formed on the data line, and the charge on the data line is transferred to the storage node or discharged from the storage node in response to the voltage of the word line.

The data stored in the memory having an active restoration function is read from the sense line in response to a first voltage which is supplied to the word line of the memory having the active restoration function, and the data in the data line are written into the storage node of the memory having the restoration function in response to a second voltage which is supplied to the word line.

The first voltage is, for example, lower than the second voltage. The memory having the active restoration function is, for example, a scalable two-transistor memory.

According to another aspect of the present invention, there is provided a semiconductor memory device having an active restoration function, the semiconductor memory device comprising a sense line which carries sense data read from the memory having the active restoration function, a data line connected to the memory having the active restoration function, and an inverting sense amplifier connected between the sense line and the data line which senses and inverts the sense data on the sense line, which outputs the inverted data to the data line, and which senses and inverts the data on the bit line, and outputs inverted data to the sense line, wherein data on the data line are written to the memory having the active restoration function.

The data stored in the memory having the active restoration-function are read from the bit line in response to a first voltage, which is supplied to the word line of the memory having the active restoration function, and the data in the data line are written to the memory having the active restoration memory, in response to a second voltage which is supplied to the word line.

According to another aspect of the present invention, there is provided a semiconductor memory device comprising a first block which has a first bit line, a first data line, and a memory having a first active restoration function that is connected between the first bit line and the first data line, a second block which has a second bit line, a second data line, and a memory having a second active restoration function that is connected between the second bit line and the second data line, and an inverting sense amplifier which is laid out between the first block and the second block and connected between the first bit line and the first data line, wherein the first bit line is connected to the second data line through the inverting sense amplifier and the first data line is connected to the second bit line through the inverting sense amplifier, and the polarity of the data in each bit line is opposite to the polarity of the data in each data line and the data in each data line are written to the corresponding memory having the first active restoration function or the second active restoration function.

According to another aspect of the present invention, there is provided a semiconductor memory device comprising a bit line, a data line, a memory connected between the bit line and the data line, the memory having an active restoration function, and an inverting circuit connected between the bit line and the data line, wherein the polarity of the data on the data line is opposite to the polarity of the data on the bit line.

In one example, the memory having the active restoration function and the inverting circuit constitute a latch loop.

According to another aspect of the present invention, there is provided a semiconductor memory device comprising a bit line, a first switching circuit connected between a first voltage and the bit line that switches the bit line to the first voltage in response to a control signal, a data line, a second switching circuit connected between a second voltage and the data line that switches the data line to the second voltage in response to the control signal, a memory connected between the bit line and the data line and having an active restoration function, and a third switching circuit connected between a third voltage and the data line that connects the third voltage to the data line in response to a voltage of the bit line.

In one example, the memory having the active restoration function and the third switching circuit constitute a latch.

The data in the data line are written in the memory having the active restoration function.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF PREFERRED EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete and will fully convey the concept of the invention to those skilled in the art.

Figure 3A:
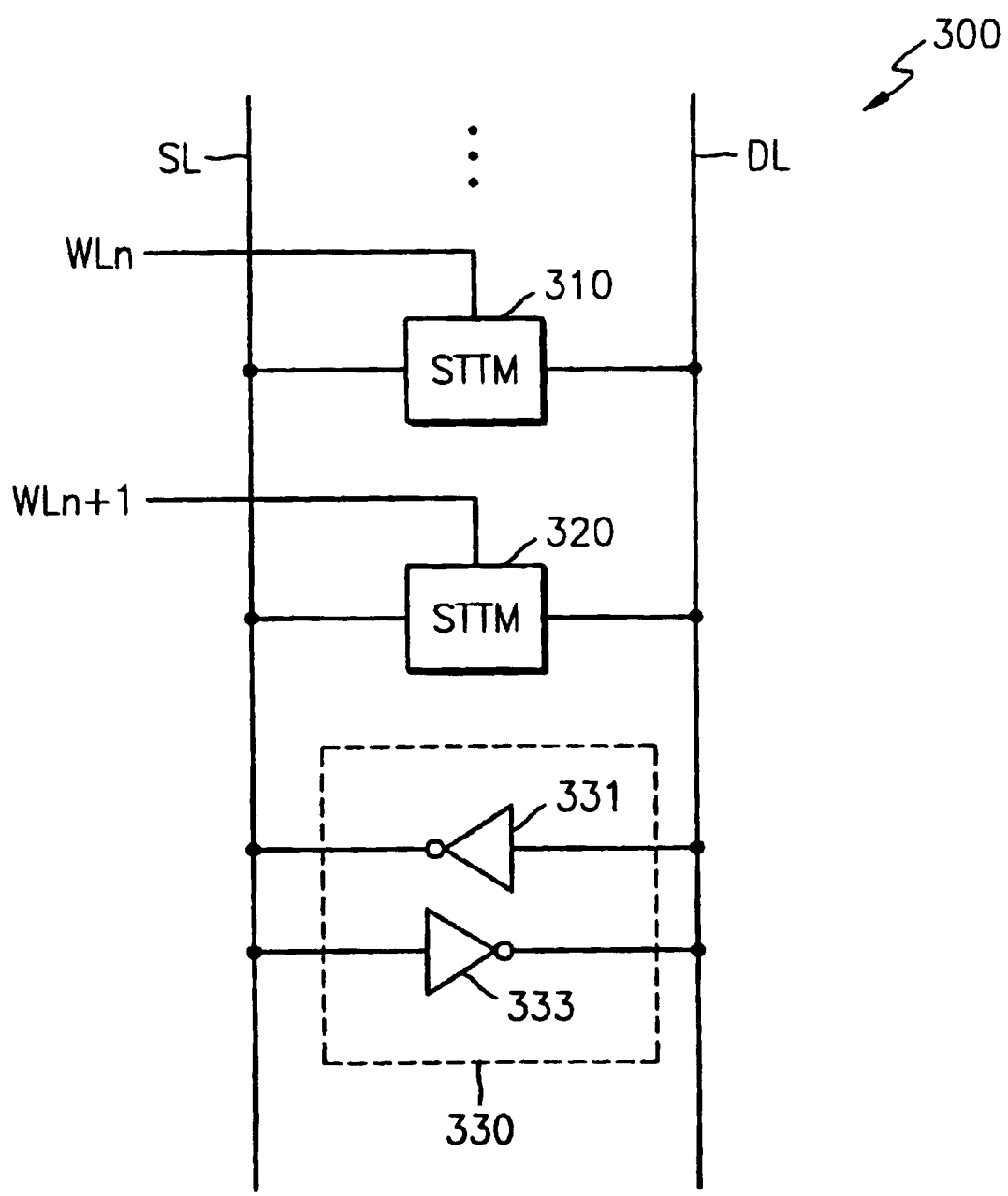
FIG. 3A is a circuit diagram of a semiconductor memory device according to a first embodiment of the present invention.

FIG. 3A is a circuit diagram of a semiconductor memory device according to a first embodiment of the present invention. Referring to FIG. 3A, a semiconductor memory device 300 includes a sense line (hereinafter referred to as SL), a data line (hereinafter referred to as DL), STTMs 310 and 320 and an inverting sense amplifier 330.

The inverting sense amplifier 330 has inverters 331 and 333. The DL is connected to an input node of inverter 331 and to an output node of inverter 333. The SL or the bit line is connected to an input node of inverter 333 and to an output node of inverter 331.

Figure 2:
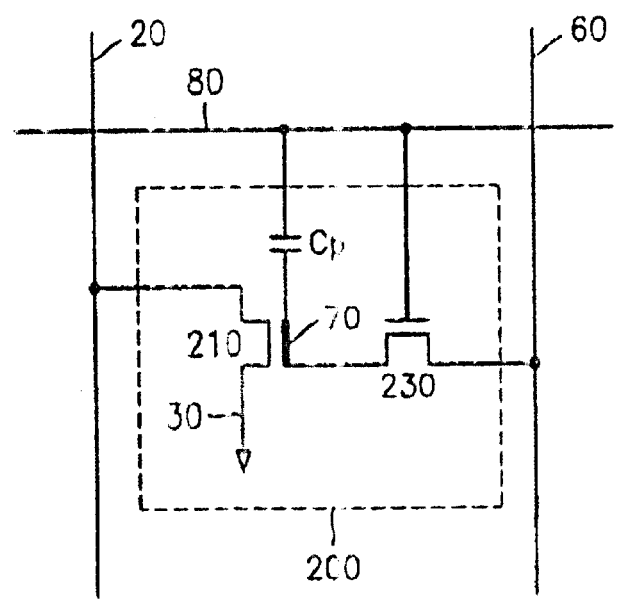
FIG. 2 is a circuit diagram of the STTM in FIG. 1.
Figure 3B:
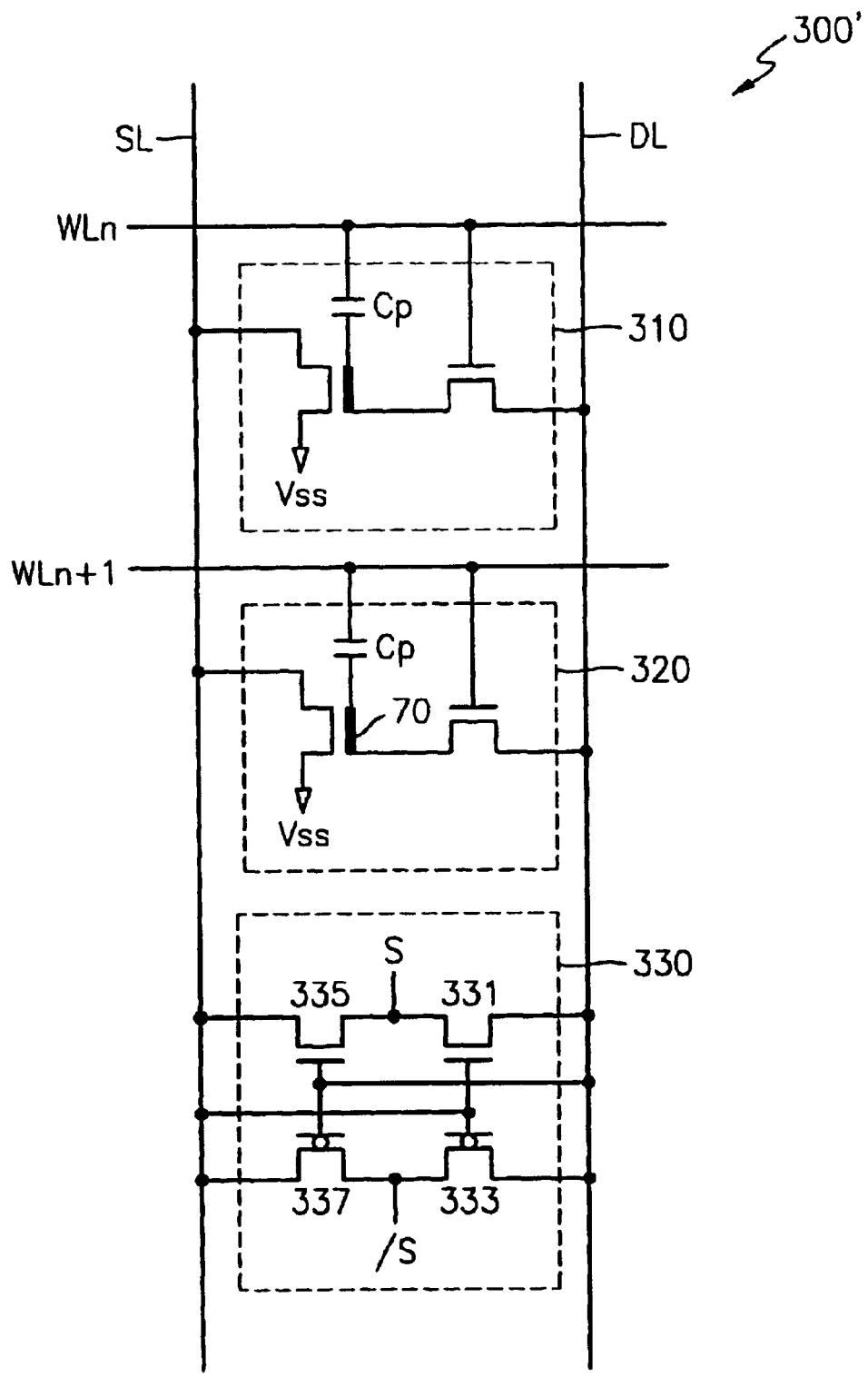
FIG. 3B is a detailed circuit diagram of the circuit of FIG. 3A, in accordance with the present invention.

FIG. 3B is a detail schematic diagram of the circuit of FIG. 3A. Referring to FIGS. 1 through 3B, STTMs 310 and 320 are connected between the SL, which is laid out in a first direction, e.g., in the vertical direction, and the DL.

The inverting sense amplifier 330 is connected between the SL and the DL. The inverting sense amplifier 330 senses, amplifies, and inverts the data located on the SL and outputs the inverted data to the DL, and senses, amplifies, and inverts the data located on the DL and outputs the inverted data to the SL.

The inverting sense amplifier 330 modifies the states of the SL and/or the DL into predetermined states S and /S in response to the data located on the SL and/or the DL. As shown in FIG. 3B, the inverting sense amplifier 330 includes a plurality of MOS transistors 331, 333, 335 and 337. Here, the predetermined states S and /S may, for example be a high or low level.

The polarity of the data on the SL, e.g., high, is opposite the polarity of the data on the DL, e.g., low.

The inverting sense amplifier 330 of FIG. 3B senses, amplifies, and inverts the low data on the SL, and outputs data which are inverted from low to high to the DL. The high data in the DL are then written into a storage node of the STTM 310, and thus the semiconductor memory device having the STTM naturally has an active restoration function.

The storage node 70 of FIG. 3B represents the gate of a transistor, the gate being formed on a semiconductor substrate 10 (refer to FIG. 1), in which a DL 60 is deposited on the storage node 70, and the data or charge in the DL 60 are written or injected in the storage node 70 or are removed or discharged from the storage node 70 according to a voltage supplied to a word line 80.

The data or charge stored in the storage node 70 of the STTM are read out to the SL 20 in response to a first voltage supplied to the word line 80 of the STTM. The data in the DL 60 is written or injected in the storage node 70 of the STTM in response to a second voltage supplied to the word line 80. The first voltage is lower than the second voltage.

Figure 4A:
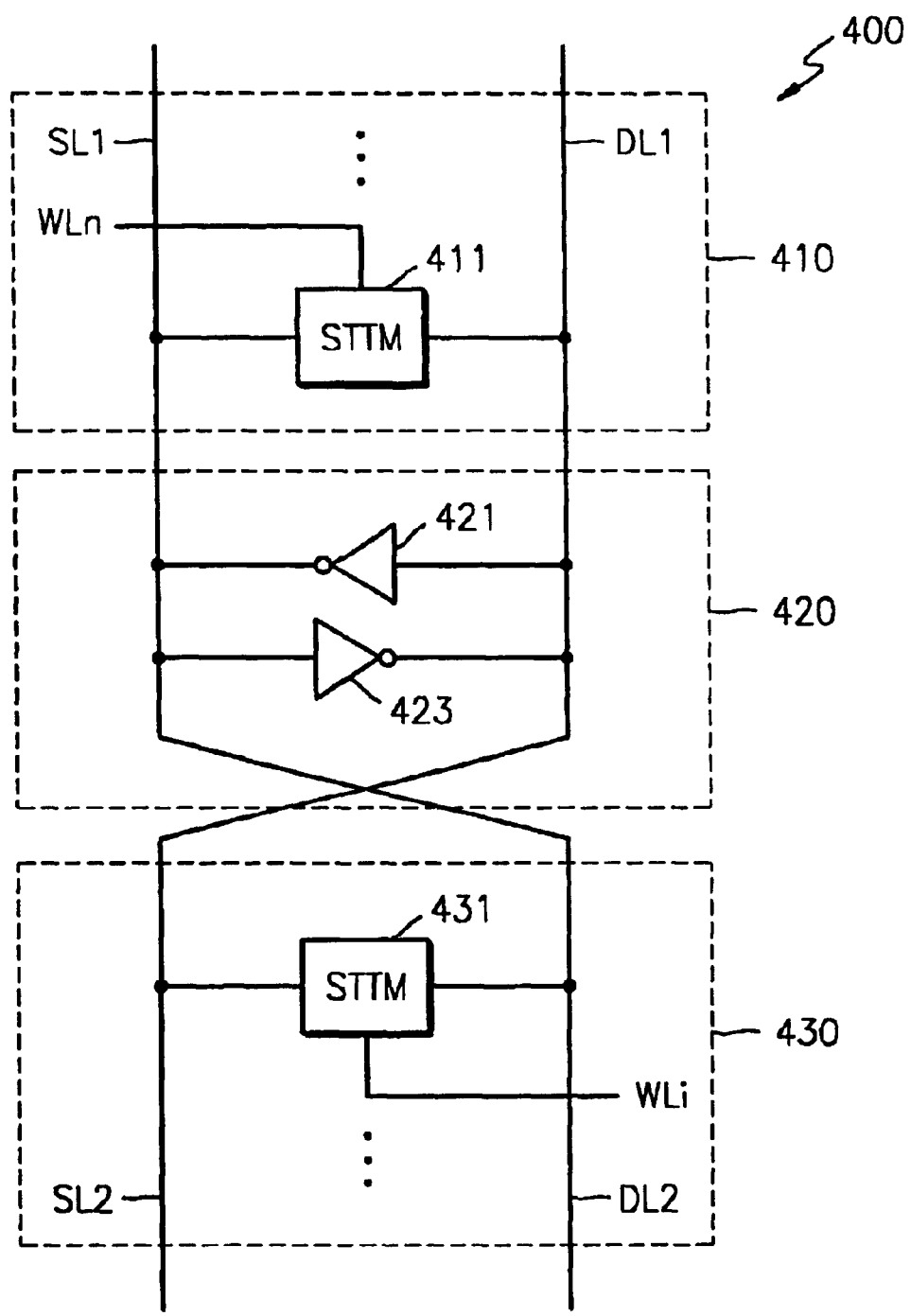
FIG. 4A is a circuit diagram of a semiconductor memory device according to a second embodiment of the present invention.
Figure 4B:
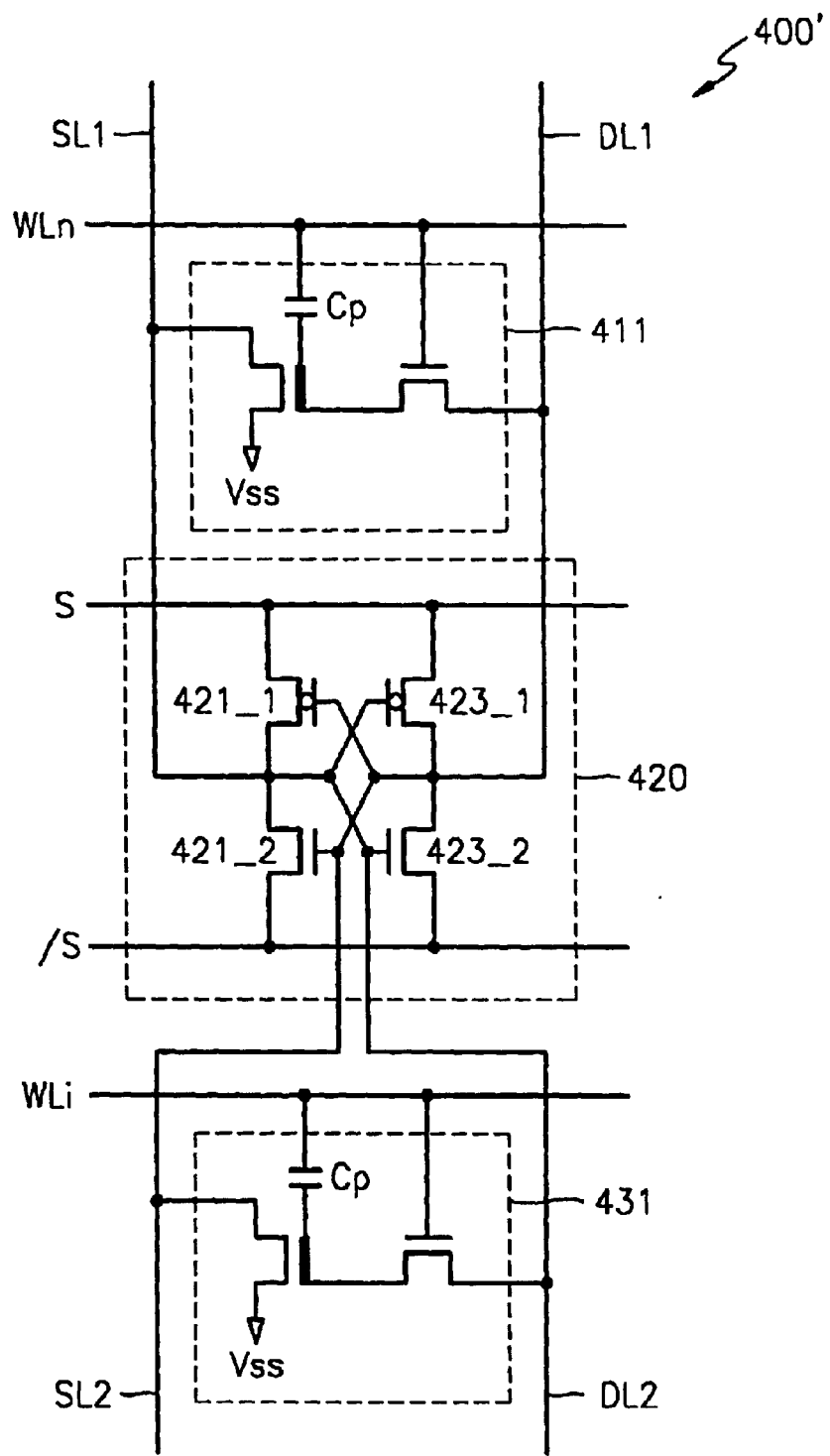
FIG. 4B is a detailed circuit diagram of the circuit of FIG. 4A, in accordance with the present invention.

FIG. 4A is a circuit diagram of a semiconductor memory device according to a second embodiment of the present invention. FIG. 4B is a detailed schematic diagram of the circuit of FIG. 4A. Referring to FIGS. 4A and 4B, semiconductor memory devices 400 and 400' include a first block 410, a second block 430, and an inverting sense amplifier 420.

The first block 410 includes a first bit line SL1, a first data line DL1, and a first STTM 411 which is connected between the first bit line SL1 and the first data line DL1. The second block 430 includes a second bit line SL2, a second data line DL2, and a second STTM 431 which is connected between the second bit line SL2 and the second data line DL2.

The inverting sense amplifier 420 is laid out between the first block 410 and the second block 430 and includes inverters 421 and 423 which are connected between the first bit line SL1 and the first data line DL1.

The inverter 423 inverts data of the first bit line SL1, and outputs the inverted data to the first data line DL1, and inverter 421 inverts data of the first data line DL1, and outputs the inverted data to the first bit line SL1. The inverting sense amplifier 420 includes a plurality of MOS transistors 421_1, 421_2, 423_1, and 423_2. The operations of the MOS transistors are well known to those skilled in the art.

The first bit line SL1 is connected to a second data line DL2 through the inverting sense amplifier 420, and the first data line DL1 is connected to the second bit line SL2 through the inverting sense amplifier 420.

Therefore, the polarities of the data in the bit lines SL1 and SL2 are opposite to the polarities of the data in the data lines DL1 and DL2. The data in the data lines DL1 and DL2 are written back to the corresponding first STTM 411 and second STTM 431, respectively.

As shown in FIGS. 4A and 4B, if the inverting sense amplifier 420 is laid out between adjacent STTM blocks 410 and 430, then the integration density of the semiconductor circuit increases. In addition, the load between the bit lines SL1 and SL2 and the data lines DL1 and DL2, which are connected to both ends of the inverting sense amplifier 420, is balanced, and thus the offset of the inverting sense amplifier 420 can be minimized.

Figure 5:
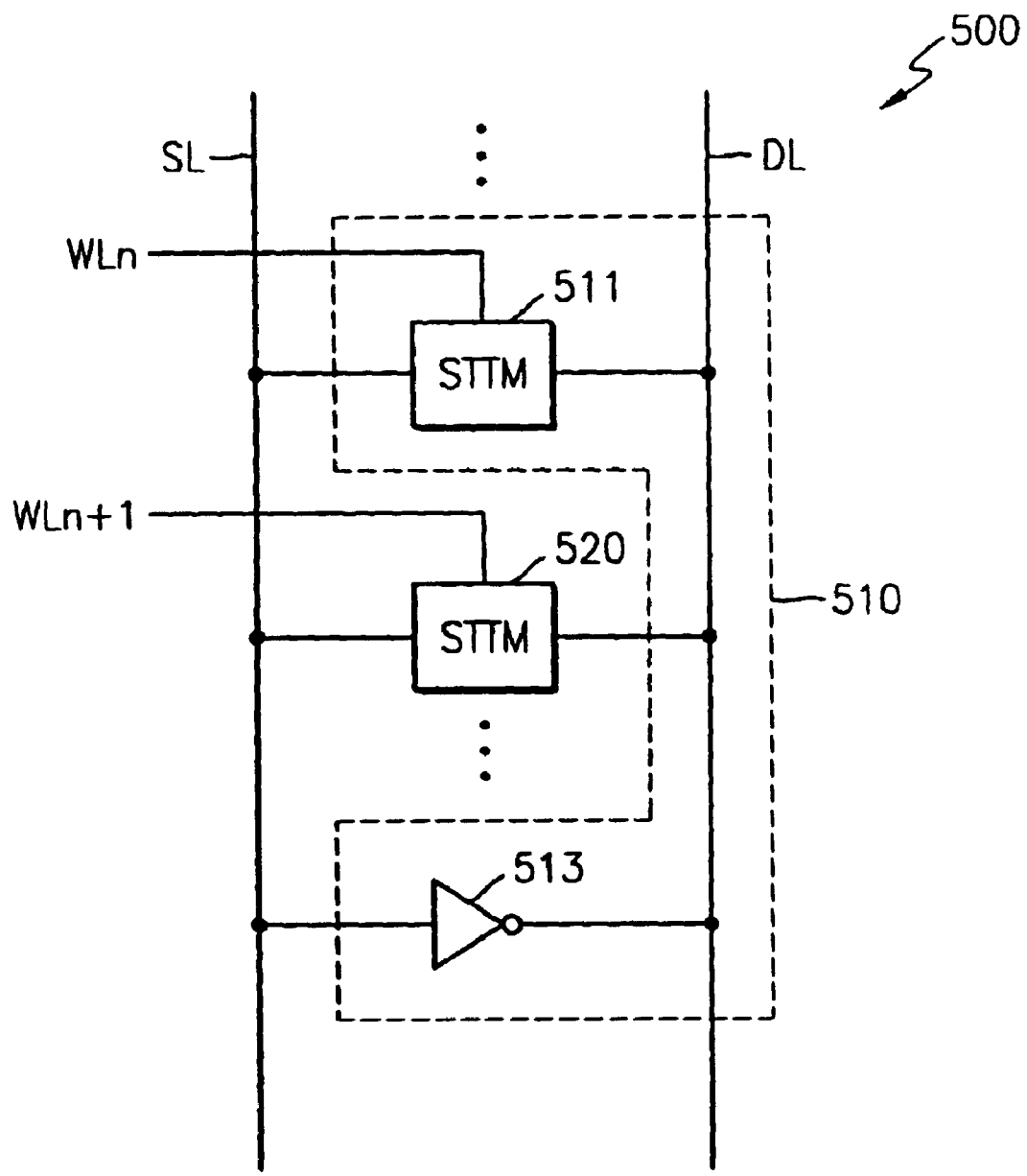
FIG. 5 is a circuit diagram of a semiconductor memory device according to a third embodiment of the present invention.

FIG. 5 is a circuit diagram of a semiconductor memory device according to a third embodiment of the present invention. Referring to FIG. 5, a semiconductor memory device 500 includes an SL, a DL, STTMs 511 and 520, which respond to corresponding word lines WLn and $WL_{n+1}$, and an inverting circuit 513. The inverting circuit 513 and the STTM that is accessed constitute a latch loop 510.

The STTM retains the data for a longer time a conventional DRAM and requires a small amount of current that is consumed in the STTM in writing data, and has an associated large current driving capacity.

Therefore, it is possible to write to or read from the STTM by using a latch 510 of the semiconductor memory device according to the present invention and actively restoring the data in the DL to the STTM.

Figure 6:
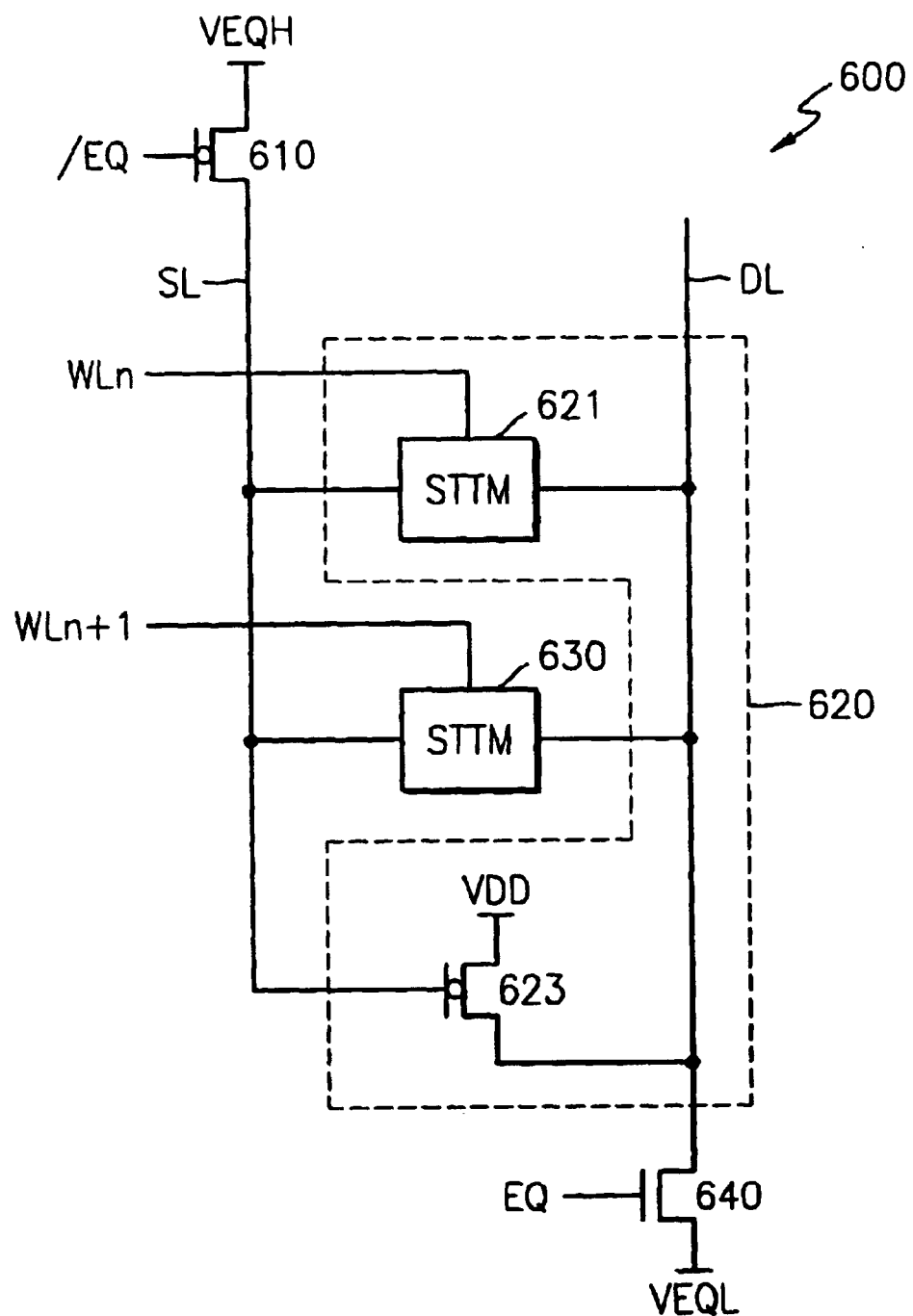
FIG. 6 is a circuit diagram of a semiconductor memory device according to a fourth embodiment of the present invention.

FIG. 6 is a circuit diagram of a semiconductor memory device according to a fourth embodiment of the present invention. Referring to FIG. 6, a semiconductor memory device 600 includes an SL, a DL, a first switching circuit 610, a latch 620, an STTM 630, and a second switching circuit 640.

The first switching circuit 610 is connected between a first voltage source VEQH and the SL and precharges a voltage level of the SL to the first voltage VEQH level in response to a control signal/EQ.

The second switching circuit 640 is connected between a second voltage source VEQL and the DL and precharges a voltage level of the DL to the second voltage VEQL level in response to a control signal EQ. Here, the first voltage VEQH level and the second voltage VEQL level are different from each other. Preferably, the first voltage VEQH level is higher than the second voltage VEQL level.

Figure 1:
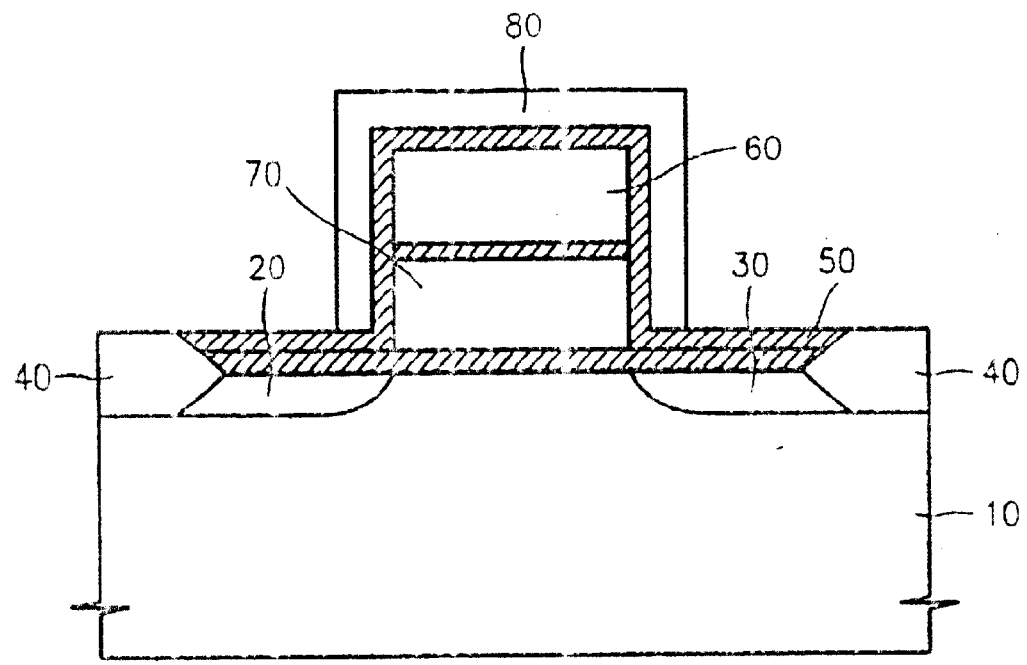
FIG. 1 is a sectional view of a conventional STTM device.

The STTM 630 is similar to the STTMs shown in FIGS. 1 and 2. The STTM 630 is connected between the SL and the DL and holds the data stored in the storage node and writes or reads the data to or from the storage node in response to the voltage of the word line $WL_{n+1}$.

The latch 620 includes an STTM 621 and a third switching circuit 623. The STTM 621 is connected between the SL and the DL, and holds the data stored in the storage node and writes or reads the data to or from the storage node in response to the voltage of the word line $WL_n$.

The third switching circuit 623 is connected between a third voltage source VDD and the DL and connects the DL to the third voltage VDD in response to the voltage of the SL.

By using the latch-type sense amplifier of the present invention to provide for the restoration function, the size of the overall layout in the semiconductor memory device can be reduced, since additional circuitry is not required.

As described above, the semiconductor memory device according to the present invention can perform an active restoration function which makes it possible to rewrite the result of a sensing operation from a sense amplifier to the data line without the need for additional circuit or operations.

In addition, the memory may be used as a part of the latch, and thus the size of the layout of the sense amplifier can be reduced.

While this invention has been particularly shown and described with reference to preferred embodiments thereof, it will be understood by those skilled in the art that various changes in form and detail may be made herein without departing from the spirit and scope of the invention as defined by the appended claims.

What is claimed is:

1. A semiconductor memory device comprising:
   a sense line;
   a data line;
   a memory connected between the sense line and the data line having an active restoration function; and
   a sense amplifier connected between the sense line and the data line, which senses and inverts data on the sense line, and outputs inverted data to the data line;

wherein data on the sense line is of a polarity that is opposite that of data on the data line, and wherein the data on the data line are written to the memory.

2. The semiconductor memory device of claim 1, wherein the memory having the active restoration function includes a storage node having a gate of a transistor formed on a semiconductor substrate, wherein the data line is formed on the storage node, wherein a word line is formed on the data line, and wherein charge on the data line is transferred to the storage node or discharged from the storage node in response to a voltage of the word line.

3. The semiconductor memory device of claim 1, wherein the data stored in the memory having the active restoration function is read from the sense line in response to a first voltage which is supplied to the word line of the memory having the active restoration function, and wherein the data in the data line are written into the storage node of the memory having the restoration function in response to a second voltage which is supplied to the word line.

4. The semiconductor memory device of claim 3, wherein the first voltage is lower than the second voltage.

5. The semiconductor memory device of claim 1, wherein the memory having the active restoration function is a scalable two-transistor memory.

6. A semiconductor memory device having an active restoration function, the semiconductor memory device comprising:
  a sense line which carries sense data read from the memory having the active restoration function;
  a data line connected to the memory having the active restoration function; and
  an inverting sense amplifier connected between the sense line and the data line, which senses and inverts the sense data on the sense line, which outputs inverted data to the data line, and which senses and inverts data on the bit line and outputs inverted data to the sense line;
  wherein data on the data line are written to the memory having the active restoration function.

7. The semiconductor memory device of claim 6, wherein the data stored in the memory having the active restoration function are read from the bit line in response to a first voltage which is supplied to the word line of the memory having the active restoration function, and wherein the data in the data line are written to the memory having the active restoration memory in response to a second voltage which is supplied to the word line.

8. A semiconductor memory device comprising:
  a first block which has a first bit line, a first data line, and a memory having a first active restoration function that is connected between the first bit line and the first data line;
  a second block which has a second bit line, a second data line, and a memory having a second active restoration function that is connected between the second bit line and the second data line; and
  an inverting sense amplifier which is laid out between the first block and the second block and connected between the first bit line and the first data line;
  wherein a first bit line is connected to the second data line through the inverting sense amplifier and wherein the first data line is connected to the second bit line through the inverting sense amplifier, and
  wherein a polarity of the data in each bit line is opposite to the polarity of the data in each data line and the data in each data line are written to the corresponding memory having the first active restoration function or the second active restoration function.

9. A semiconductor memory device comprising:
  a bit line;
  a data line;
  a memory connected between the bit line and the data line, the memory having an active restoration function; and
  an inverting circuit connected between the bit line and the data line;
  wherein data on the data line is of a polarity that is opposite that of data on the bit line.

10. The semiconductor memory device of claim 9, wherein the memory having the active restoration function and the inverting circuit constitutes a latch loop.

11. A semiconductor memory device comprising;
  a bit line;
  a first switching circuit connected between a first voltage and the bit line that switches the bit line to the first voltage in response to a control signal;
  a data line;
  a second switching circuit connected between a second voltage and the data line that switches the data line to the second voltage in response to the control signal;
  a memory connected between the bit line and the data line, the memory having an active restoration function; and
  a third switching circuit connected between a third voltage and the data line that connects the third voltage to the data line in response to a voltage of the bit line.

12. The semiconductor memory device of claim 11, wherein the memory having the active restoration function and the third switching circuit constitute a latch.

13. The semiconductor memory device of claim 11, wherein the data in the data line are written to the memory having the active restoration function.

* * * * *